(12) United States Patent
Yang et al.

(10) Patent No.: US 7,781,805 B2
(45) Date of Patent: Aug. 24, 2010

(54) MEMORY WITH HIGH DIELECTRIC CONSTANT ANTIFUSES ADAPTED FOR USE AT LOW VOLTAGE

(75) Inventors: Xiaoyu Yang, Campbell, CA (US); Roy E. Scheurelein, Cupertino, CA (US); Feng Li, San Jose, CA (US); Albert T. Meeks, Sunnyvale, CA (US)

(73) Assignee: SanDisk 3D LLC, Milpitas, CA (US)

( * ) Notice: Subject to any disclaimer, the term of this patent is extended or adjusted under 35 U.S.C. 154(b) by 0 days.

(21) Appl. No.: 12/367,214

(22) Filed: Feb. 6, 2009

(65) Prior Publication Data

US 2009/0140299 A1    Jun. 4, 2009

Related U.S. Application Data

(63) Continuation of application No. 11/173,973, filed on Jul. 1, 2005, now abandoned.

(51) Int. Cl.
*H01L 29/66* (2006.01)

(52) U.S. Cl. .............. 257/209; 257/530; 257/E29.081; 257/E29.085; 257/E29.091; 257/E29.33; 438/597; 365/103

(58) Field of Classification Search .......... 257/209, 257/530; 438/597; 365/103
See application file for complete search history.

(56) References Cited

U.S. PATENT DOCUMENTS

| | | | |
|---|---|---|---|
| 5,658,819 A * | 8/1997 | Humphrey et al. ......... 438/600 |
| 5,915,167 A | 6/1999 | Leedy | |
| 5,962,910 A * | 10/1999 | Hawley et al. ............ 257/530 |
| 5,994,757 A | 11/1999 | Ichikawa et al. | |
| 6,034,882 A | 3/2000 | Johnson et al. | |
| 6,420,215 B1 | 7/2002 | Knall et al. | |
| 6,525,953 B1 | 2/2003 | Johnson | |
| 6,574,145 B2 | 6/2003 | Kleveland et al. | |
| 6,879,505 B2 | 4/2005 | Scheuerlein | |
| 6,956,278 B2 | 10/2005 | Herner | |
| 7,053,406 B1 | 5/2006 | Ho et al. | |
| 7,224,013 B2 | 5/2007 | Herner et al. | |
| 7,304,888 B2 | 12/2007 | Knall | |
| 7,453,755 B2 | 11/2008 | Cleeves | |

(Continued)

OTHER PUBLICATIONS

Introduction and H-1, Symbols, Definitions and Formulae' [online], [retrieved on Jun. 25, 2007]. p. 5 of 6, Section 1.27. Retrieved from the internet: <URL: http://www.chem.qmul.ac.uk/ipac/sectionH/H1.html.>.

(Continued)

*Primary Examiner*—A. Sefer
(74) *Attorney, Agent, or Firm*—Dugan & Dugan, PC

(57) ABSTRACT

A memory array having memory cells comprising a diode and an antifuse can be made smaller and programmed at lower voltage by using an antifuse material having a higher dielectric constant and a higher acceleration factor than those of silicon dioxide, and by using a diode having a lower band gap than that of silicon. Such memory arrays can be made to have long operating lifetimes by using the high acceleration factor and lower band gap materials. Antifuse materials having dielectric constants between 5 and 27, for example, hafnium silicon oxynitride or hafnium silicon oxide, are particularly effective. Diode materials with band gaps lower than that of silicon, such as germanium or a silicon-germanium alloy, are particularly effective.

16 Claims, 11 Drawing Sheets

U.S. PATENT DOCUMENTS

| | | |
|---|---|---|
| 2004/0002184 A1 | 1/2004 | Cleeves |
| 2004/0108573 A1 | 6/2004 | Herner |
| 2004/0262702 A1 | 12/2004 | Herner |
| 2005/0098800 A1 | 5/2005 | Herner et al. |
| 2005/0121742 A1 | 6/2005 | Petti et al. |
| 2006/0073642 A1* | 4/2006 | Yeh et al. .................... 438/132 |
| 2006/0249753 A1 | 11/2006 | Herner et al. |
| 2006/0250836 A1 | 11/2006 | Herner et al. |
| 2006/0273298 A1 | 12/2006 | Petti |
| 2007/0069241 A1 | 3/2007 | Yang et al. |
| 2009/0141535 A1 | 6/2009 | Yang et al. |

OTHER PUBLICATIONS

Molecular Formula: Definition and Much More from Answers.com' [online], [retrieved on Jun. 25, 2007]. Retrieved from the internet: <URL:http:www.answers.com/topic/chemical-formula@cat=health>.

Chemistry Lecture 101 (Rough Draft) [online], [retrieved on Jun. 25, 2007]. Retrieved from the internet: <URL:http.www.personal/psu/edu.wxm15/Online/Chem_Unit/chem_lec101.htm>.

McPherson, J., et al., "Proposed Universal Relationship Between Dielectric Breakdown and Dielectric Constant", IEDM paper No. 26.6 (Dec. 2002).

McPherson, J., et al., "Trends in the Ultimate Breakdown Strength of High Dielectric-Constant Materials", IEEE Transactions on Electron Devices, vol. 50, No. 8 (Aug. 2003), 1771-1778.

Herner, S. Brad, et al., U.S. Appl. No. 10/326,470, filed Dec. 19, 2002.

Office Action of U.S. Appl. No. 11/173,973 mailed on Jan. 24, 2007.

Final Office Action of U.S. Appl. No. 11/173,973 mailed Dec. 26, 2007.

Final Office Action of U.S. Appl. No. 11/173,973 mailed Jan. 23, 2009.

Reply to Jan. 24, 2007 Office Action of U.S. Appl. No. 11/173,973.

Reply to Dec. 26, 2007 Final Office Action of U.S. Appl. No. 11/173,973.

Notice of Non-Compliant Amendment of U.S. Appl. No. 11/173,973 mailed Sep. 4, 2007.

Jun. 29, 2007 Reply to Jan. 24, 2007 Office Action of U.S. Appl. No. 11/173,973.

Notice of Abandonment of U.S. Appl. No. 11/173,973 mailed Jul. 11, 2008.

Aug. 25, 2008 Petition for Revival of an Application of U.S. Appl. No. 11/173,973.

Decision on Petition of U.S. Appl. No. 11/173,973 mailed Dec. 10, 2008.

Notice of Abandonment of U.S. Appl. No. 11/173,973 mailed Aug. 13, 2009.

* cited by examiner

| Material | Dielectric Constant K | Electric Field Acceleration Factor $\gamma = K^{0.66}$ | Electric Field Breakdown Strength $E_{bd} = K^{-0.66}$ |
|---|---|---|---|
| $SiO_2$ | 3.9 | 3.5 cm/MV | 13.6 MV/cm |
| $Si_3N_4$ | 7.5 | 5 cm/MV | 10.2 MV/cm |
| $HfO_2$ | 25 | 10 cm/MV | 3.9 - 6.7 MV/cm |
| HfSiON | 6.5 | 6.5 cm/MV | 7 MV/cm |
| $Ta_2O_5$ | 26 | 13.6 cm/MV | 2.6 - 3.7 MV/cm |

Fig. 7

Write Voltages

Write Voltages

MEMORY WITH HIGH DIELECTRIC CONSTANT ANTIFUSES ADAPTED FOR USE AT LOW VOLTAGE

REFERENCE TO RELATED APPLICATIONS

This application is a continuation of U.S. patent application Ser. No. 11/173,973, filed on Jul. 1, 2005. This application relates to U.S. patent application Ser. No. 11/174,234 by N. Johan Knall, titled "REVERSE-BIAS METHOD FOR WRITING MEMORY CELLS IN A MEMORY ARRAY," and to U.S. patent application Ser. No. 11/174,240, by James M. Cleeves, titled "MEMORY CELL WITH HIGH-K ANTIFUSE FOR REVERSE BIAS PROGRAMMING," each of which also was filed on Jul. 1, 2005, and is incorporated herein by reference in its entirety.

BACKGROUND

The invention relates to programming and reading an array of nonvolatile memory cells each comprising a diode in series with an antifuse.

Integrated circuit memories are typically large arrays of memory cells connected between bit lines and word lines. In order to achieve reliable programming and reading of the memory cells within the array, memory cells selected to be programmed or read must be isolated from memory cells that are not selected. Also, as it becomes increasingly important to minimize power used by integrated circuit devices, it is desirable to minimize power consumption in integrated circuit memories. Lowering the voltage for reading and writing usually reduces power consumption. Also lowering the voltage usually allows elements of the integrated circuit device to shrink, thus reducing manufacturing cost. Therefore it is desirable to program and operate memories at lower voltages.

FIG. 1 shows a representative portion of an integrated circuit memory array in which voltages have been applied in order to program one of the memory cells. Each of the memory cells comprises a diode in series with an antifuse connected between one of the word lines and one of the bit lines in the memory array. In FIG. 1, the cell selected to be programmed is at the intersection of word line WL4 and bit line BL2. In order to program this cell, a high voltage of 9 volts is applied to word line WL4 and a ground voltage of 0 volts is applied to bit line BL2, thus applying 9 volts to selected cell 4, 2 at this intersection. To avoid programming any of the other unselected cells, other bit lines receive a voltage of 8.5 volts and other word lines receive 0.5 volts. This causes all unselected cells, for example cell 1, 1 to receive a reverse bias voltage (in the reverse direction of normal current flow through the diode) of −8.0 volts. Half-selected cells (in which either the word line or the bit line receives a selected voltage) receive a forward bias voltage of 0.5 volts, which is less than the threshold voltage of the diodes, so only a small amount of current flows through the half-selected cells. In order to avoid reverse bias breakdown, the diodes must be manufactured so that they can tolerate the reverse bias of 8 volts, and the antifuses must be manufactured to be somewhat leaky so that most of the voltage drop is across the diode and not the antifuse to assure that this relatively high voltage does not cause programming of the antifuse in unselected cells. However, during programming, the reverse leakage through the unselected cells causes power drain. In a large array having many unselected memory cells, this power drain can be considerable. For example, in a two-dimensional array of 1000×1000 memory cells, there are one million memory cells. If only one row and one bit line are selected, there are 999×999 unselected cells all receiving an 8-volt bias, producing considerable power drain through the array. It is desirable to minimize power drain, and particularly important to minimize power drain in battery operated applications. It is also desirable to shrink the area occupied by the memory array, thereby reducing cost.

Other materials besides silicon and silicon dioxide have been considered for making some integrated circuit structures. FIG. 2a, taken from IEDM December 2002 paper number 26.6 by J. McPherson, et al., titled "Proposed Universal Relationship Between Dielectric Breakdown and Dielectric Constant," shows measured values of dielectric constant and breakdown strength for about 10 materials and shows that the correlation coefficient between dielectric constant and breakdown strength is about 0.81, which indicates a high correlation between the two parameters.

A paper by Joe W. McPherson, et al., titled "Trends in the Ultimate Breakdown Strength of High Dielectric-Constant Materials," published in IEEE Transactions on Electron Devices, Vol. 50, No. 8, August 2003, indicates that the ultimate breakdown strength $E_{bd}$ of a dielectric material is found to decrease as the dielectric constant K increases. The paper indicates that great interest exists in the breakdown strength of high-K dielectrics because for CMOS technology scaling to continue, the conventional $SiO_2$ gate-dielectric (which has a high $E_{bd}$) must be replaced. The paper gives new time-dependent dielectric breakdown (TDDB) data over a wide range of dielectric materials. The paper also discusses acceleration factor (the relationship between voltage and time to breakdown) and gives acceleration factor data for selected materials. But the McPherson et al. paper says nothing about materials used for making antifuses or diodes such as are used for making memory cells.

FIG. 2b, taken from the August 2003 paper by Joe W. McPherson, et al., also examines breakdown strengths of four materials: silicon dioxide ($SiO_2$), hafnium silicon oxynitride (HfSiON), tantalum oxide ($Ta_2O_5$), and PZT (a lead zirconate titanate ceramic), as a function of dielectric constant. (FIGS. 2a and 2b have a different appearance, but that is mainly because FIG. 2a uses log-log scales and FIG. 2b uses linear scales.)

SUMMARY

The present invention is defined by the appended claims, and nothing in this section should be taken as a limitation on those claims. In general, the invention is directed to methods of forming and programming an array of nonvolatile memory cells each comprising an antifuse in series with a diode. The invention takes advantage of the one-way nature of the diode and uses materials that allow for lower voltage operation. In particular, antifuses having dielectric constants higher than that of silicon dioxide and diodes having band gaps lower than that of silicon are found to be effective in allowing the memories to operate at lower voltages.

In order to shrink the memory cell horizontal area without having manufacturing problems, the vertical dimension of the memory cell must also be reduced, and that means the write voltage and read voltage must be reduced. But antifuses and diodes made from films of silicon dioxide have already been made just a few atoms thick, and cannot be made thinner. However, using a material with a higher dielectric constant allows films of dielectric to be thicker for the same breakdown field strength (breakdown voltage divided by thickness is breakdown field strength).

One aspect of the invention is to form a memory cell from a diode in series with an antifuse where the antifuse is made, not from silicon dioxide, but from a material having a higher dielectric constant than silicon dioxide. The elements lanthanum (La), hafnium (Hf), tantalum (Ta), yttrium (Y), zirconium (Zr), and niobium (Nb) when oxidized or combined with nitrogen form dielectrics with higher dielectric constants than silicon dioxide and can each be used to form antifuses in memory cells that can be written and read at lower voltages than silicon dioxide.

An aspect of the invention is to assure that the dielectric constant of the insulator used for the memory cell antifuse is higher than that of silicon dioxide (3.9). In particular, a dielectric constant range of approximately 5 to 27 in the antifuse and a band gap smaller than that of silicon work well to produce memory cells that can be reliably read and written at lower voltages than memory cells of silicon dioxide and silicon.

When the antifuse is formed from an insulator having a dielectric constant above about 5 and the diode is a thin film with a band gap smaller than silicon, the memory cells can be programmed by applying a low voltage in a direction opposite that of natural current flow through the diode, which shorts the antifuse to produce the programmed memory cell. A programming voltage sufficient to short the antifuse can be lower than that required to program a memory cell made from a silicon dioxide antifuse and a doped silicon diode. While a selected memory cell is being programmed, unselected memory cells preferably receive minimal voltage, thus minimizing power consumption in the memory array.

It is also advantageous to program such a memory cell by applying two voltages in the forward direction of the diode. The first application of voltage shorts the antifuse (forms a conductive path through the antifuse), and the second application of voltage makes a larger opening at the location of the short, thus reducing resistance to current flow through the short location.

It is important to avoid disturbing or programming unselected memory cells while programming the selected cells. It is also important to avoid disturbing any of the memory cells while reading the memory cells, and this is true for the life of the device, which may be on the order of 10 years. A memory cell array is accessed by word lines and bit lines, typically running orthogonal to each other in separate horizontal layers of an integrated circuit structure, such that each memory cell is accessed by one word line and one bit line. The memory cells of the present invention each comprise an antifuse in series with a diode. The antifuse may be placed at either the cathode end or the anode end of the diode. According to one aspect of the invention, while a voltage sufficient to short an antifuse is applied to a bit line contacting the selected memory cell and a ground voltage is applied to a word line contacting the selected memory cell, a voltage less than or equal to the diode threshold voltage is applied to bit lines of unselected cells and a voltage that is lower than the voltage sufficient to short an antifuse of a memory cell by one diode threshold voltage is applied to word lines contacting unselected memory cells. This assures that the selected memory cell is programmed and that unselected memory cells are not programmed or otherwise disturbed.

BRIEF DESCRIPTION OF THE DRAWINGS

Features of the present invention can be more clearly understood from the following detailed description considered in conjunction with the following drawings, in which the same reference numerals denote the same elements throughout.

FIG. 7 shows a table of dielectric constant, acceleration factor, and breakdown strength for several materials usable in the manufacture of integrated circuit memory arrays.

DETAILED DESCRIPTION

When developing improvements in integrated circuit memories, it is desirable to reduce the cost of manufacturing while improving operating speed, reducing power consumption, and maintaining a good useful lifetime of the devices. The present invention is directed to memory arrays in which memory cells are formed from a diode and an antifuse connected in series. Preferred embodiments orient the diode and antifuse in a vertical stack between word lines and bit lines.

Figure 1:
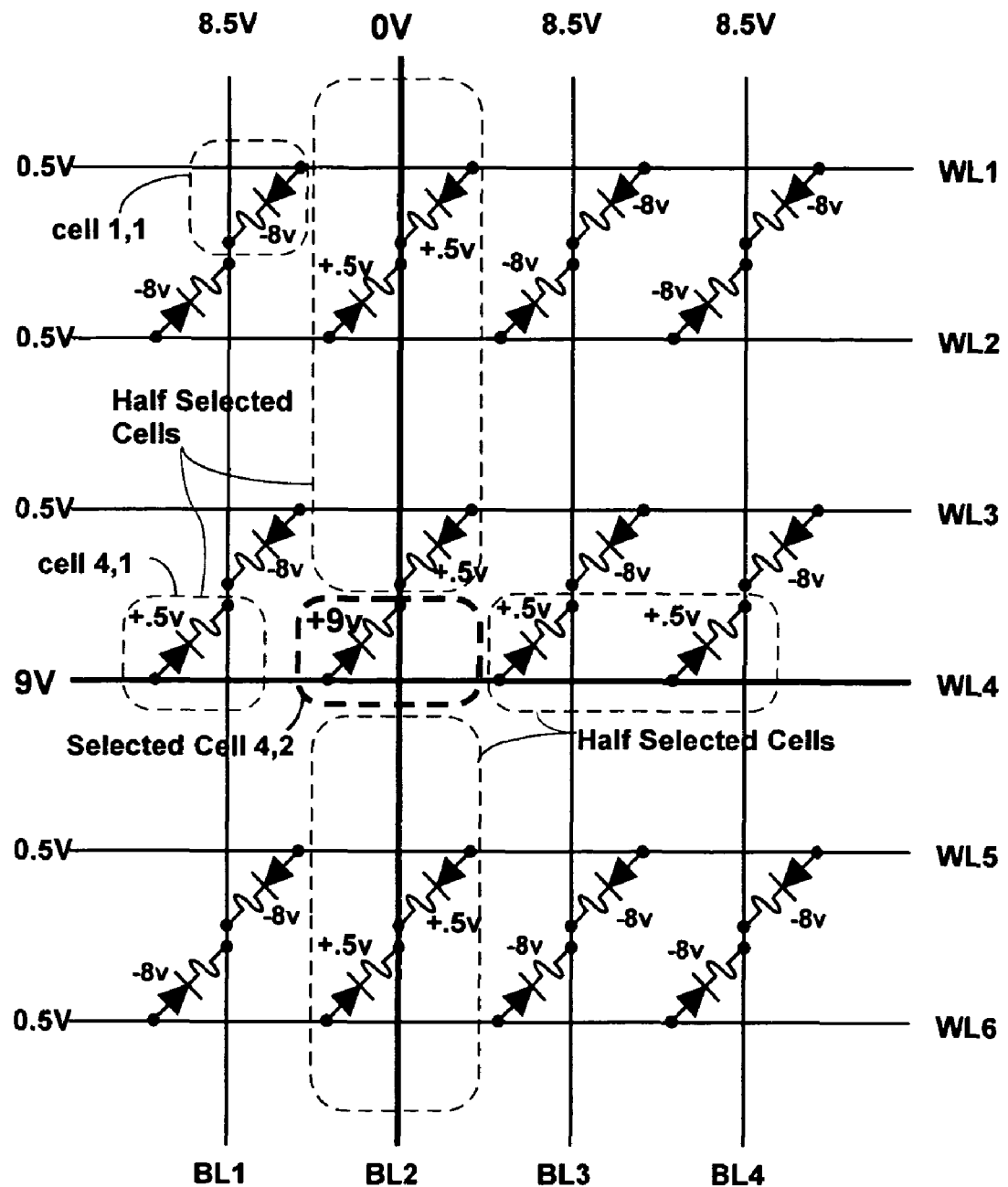
FIG. 1 is a memory array showing prior art programming voltages.

A critical requirement for shrinking memory devices to deep submicron sizes is to reduce the voltage levels required to write and read the memory cells. For example, whereas the prior art programming voltage illustrated in FIG. 1 is about 9 volts, the present invention will allow programming in the range of 3 to 5 volts. Read voltage can similarly be reduced to about 1 to 1.5 volts. Reducing the required read and write voltages of the memory cells also allows shorter channel length CMOS devices to be used in support circuits. When the write voltage is reduced in the diode-plus-antifuse memory cells of the invention, the length of the intrinsic or lightly doped region between the heavily doped n+ and p+ portions of the diode can be reduced. Thus, a shorter vertical diode can be used in the memory cell. The horizontal spacing between memory cells can be reduced as the vertical diode is reduced in height, which further reduces the area of the memory array. This area reduction and voltage reduction reduces cost and power consumption. The lower write voltage is particularly important for the diode-plus-antifuse memory cells of this invention because leakage currents in the large number of unselected memory cells is correspondingly reduced by reducing voltage applied to the unselected cells.

Careful attention to several parameters of materials used in the memory cells is especially important to reduce the write and read voltages applied to diode-plus-antifuse memory arrays and especially for monolithic three-dimensional memory arrays. A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "THREE DIMENSIONAL STRUCTURE MEMORY." The substrates of stacked memories may be thinned or removed from the memory levels before bonding, but since the memory levels are initially formed over separate substrates, such memories are not true monolithic three dimensional memory arrays.

Figure 3A:
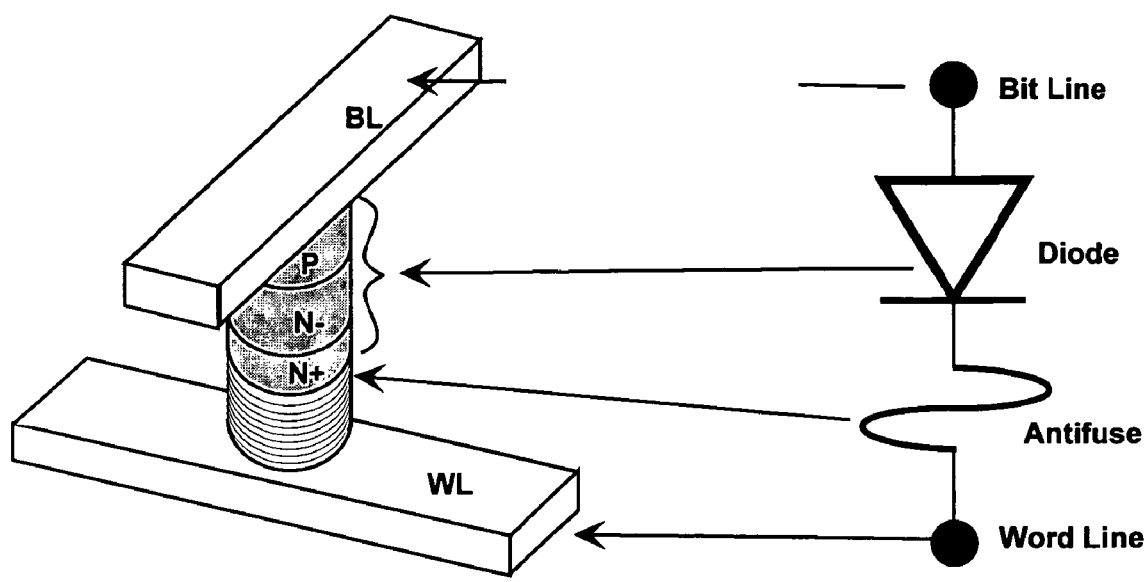
FIGS. 3a and 3b shows an exemplary physical structure of memory cell elements comprising a diode plus an antifuse in a three-dimensional array.
Figure 3B:
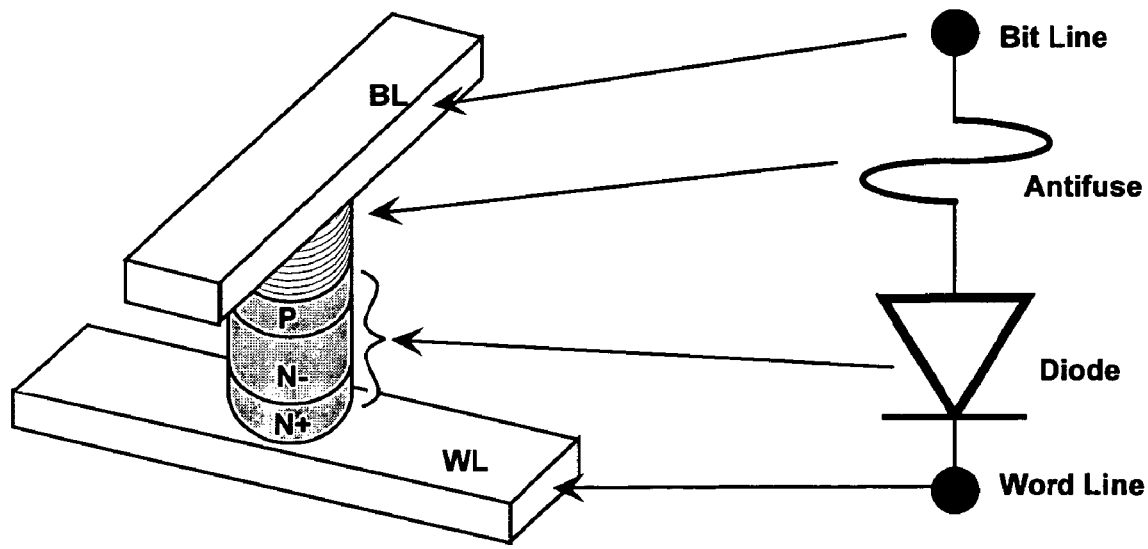

FIGS. 3a and 3b illustrate the structure of two embodiments of the invention. The diode is made up of a P layer on top of an N− layer on top of an N+ layer. In FIG. 3a, this diode sits on an antifuse, which sits on a word line WL. A bit line runs horizontally in a first direction above the diode structure. The word line WL runs horizontally in a second direction below the antifuse structure. Thus, the antifuse is at the cathode end of the diode and is positioned between the cathode end of the diode and the cathode end of the entire memory cell. In FIG. 3b, the structure is similar except that the P layer of the diode is adjacent the antifuse and therefore the antifuse is between the anode end of the diode and the anode end of the memory cell. In another embodiment not shown, the antifuse is positioned between the P layer of the diode and the N layers of the diode. The invention can incorporate any desired diode plus antifuse arrangement. The memory cell will be described as having a cathode end and an anode end even though an antifuse may be between the end of the diode and the end of the memory cell. Further information about manufacturing diodes useful with the present invention can be found in:

Herner and Dunton, U.S. patent application Ser. No. 11/125,606, titled "HIGH-DENSITY NONVOLATILE MEMORY ARRAY FABRICATED AT LOW TEMPERATURE COMPRISING SEMICONDUCTOR DIODES," filed May 9, 2005; and Herner and Walker, U.S. patent application Ser. No. 10/954,577, titled "JUNCTION DIODE COMPRISING VARYING SEMICONDUCTOR COMPOSITIONS," filed Sep. 29, 2004.

Suitable memory cell structures and configurations useful for cross-point antifuse arrays include, without limitation, those described in the following enumerated disclosures, each of which is incorporated herein by reference in its entirety:

Johnson, et al., U.S. Pat. No. 6,034,882, titled "VERTICALLY STACKED FIELD PROGRAMMABLE NONVOLATILE MEMORY AND METHOD OF FABRICATION";

Knall, et al., U.S. Pat. No. 6,420,215, titled "THREE-DIMENSIONAL MEMORY ARRAY AND METHOD OF FABRICATION";

Johnson, U.S. Pat. No. 6,525,953, titled "VERTICALLY-STACKED, FIELD PROGRAMMABLE NONVOLATILE MEMORY AND METHOD OF FABRICATION";

Cleeves, U.S. patent application Ser. No. 10/185,508, filed Jun. 27, 2002, titled "THREE DIMENSIONAL MEMORY";

Herner, et al., U.S. patent application Ser. No. 10/326,470, filed Dec. 19, 2002, titled "AN IMPROVED METHOD FOR MAKING A HIGH DENSITY NONVOLATILE MEMORY"; and Herner, et al., U.S. patent application Ser. No. 11/015,824, titled "NONVOLATILE MEMORY CELL COMPRISING A REDUCED HEIGHT VERTICAL DIODE," filed Dec. 17, 2004.

Figure 4:
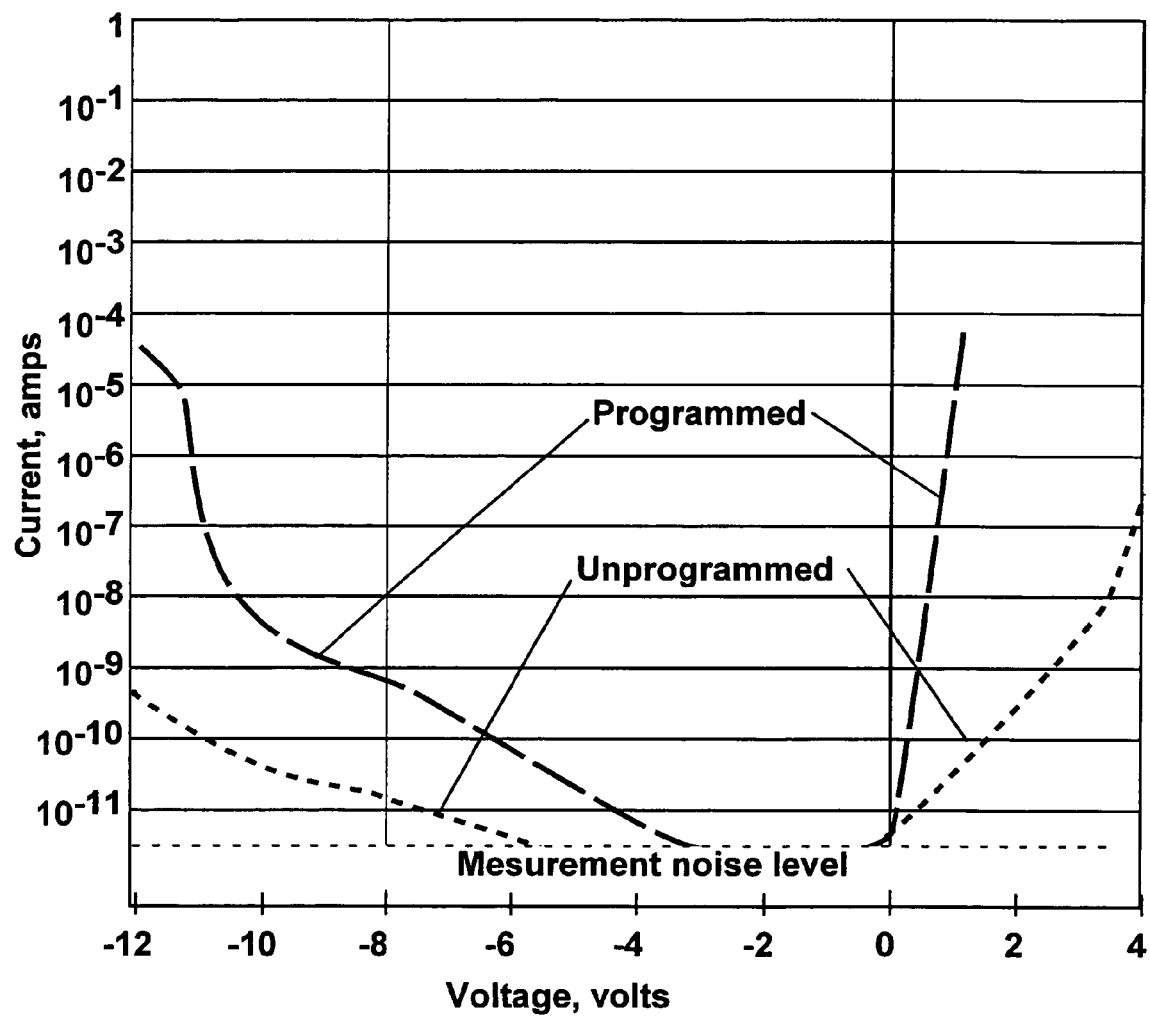
FIG. 4 shows voltage versus current curves for some programmed and unprogrammed memory cells in exemplary devices.
Figure 5:
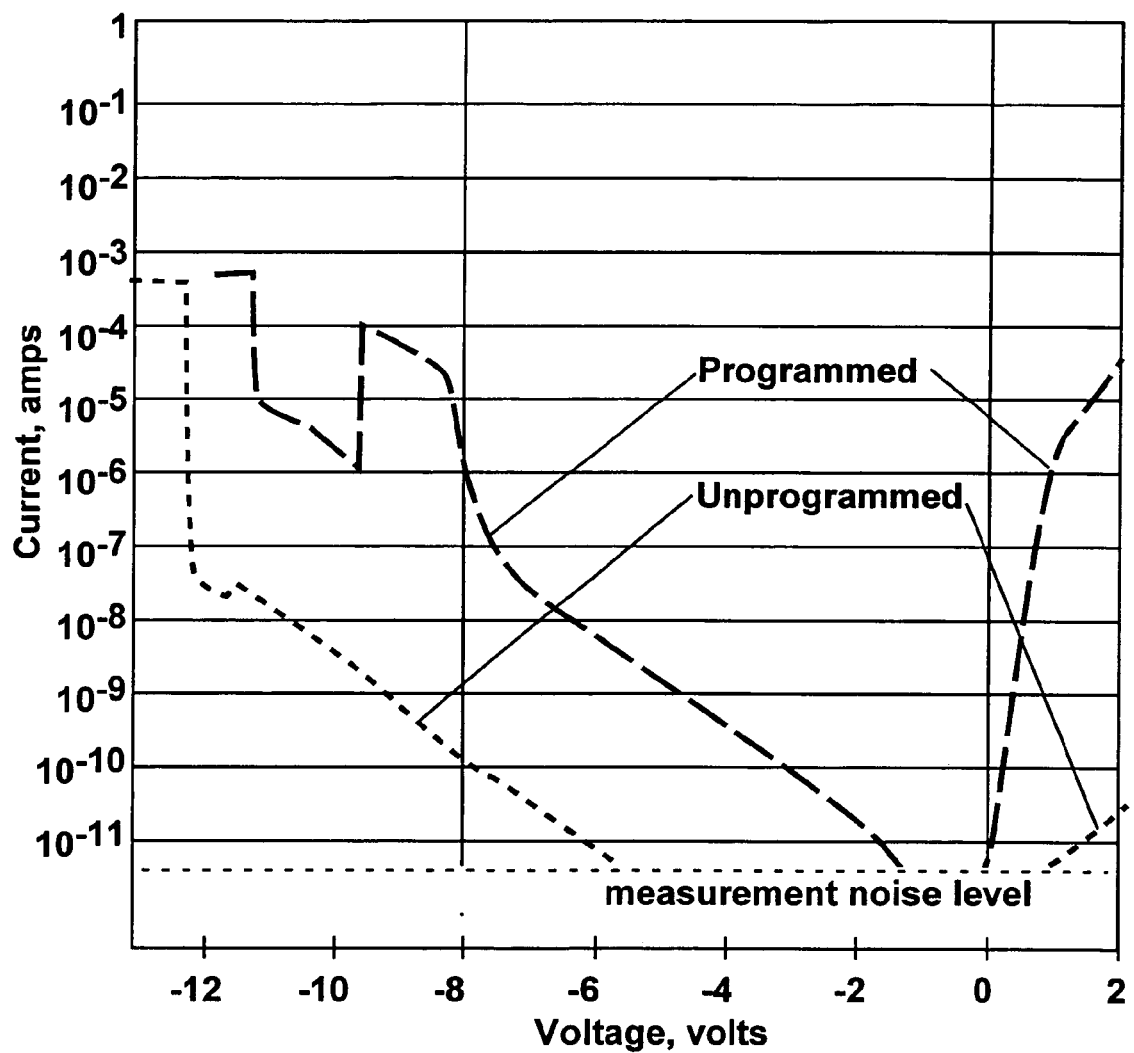
FIG. 5 shows voltage versus current curves similar to those of FIG. 4 but in which the height of a memory cell has been reduced.

FIGS. 4 and 5 show voltage versus current curves for exemplary devices. FIG. 4 shows the current to voltage characteristic curves of a re-crystallized silicon diode-plus-antifuse memory cell incorporating a vertical diode with a height of 350 nanometers. FIG. 5 shows the characteristic curves of a similar cell incorporating a vertical diode with a height of 220 nanometers. The invention is envisioned with diodes that are even shorter. Some embodiments of the invention incorporate low band gap materials such as a silicon germanium alloy or even a pure germanium semiconductor as the low bandgap material. Examples of such diodes for incorporation in the memory cell are described in more detail in the following references, each of which is incorporated in its entirety herein by reference:

Herner, et al., U.S. patent application Ser. No. 10/326,470, supra;

Petti, et al., U.S. patent application Ser. No. 10/728,230, "SEMICONDUCTOR DEVICE INCLUDING JUNCTION DIODE CONTACTING CONTACT-ANTIFUSE UNIT COMPRISING SILICIDE," filed Dec. 3, 2003; and Herner, et al., U.S. patent application Ser. No. 10/954,577, "JUNCTION DIODE COMPRISING VARYING SEMICONDUCTOR COMPOSITIONS," filed Sep. 29, 2004.

It is desirable to reduce the height of vertical memory cell structures in order to reduce gaps formed as the structures are being patterned and filled with a dielectric. Deep gaps are difficult to fill without leaving voids that can cause manufacturing and reliability problems. The maximum aspect ratio that can be used without defects is determined by the manufacturing equipment. Thus, using a tall memory cell limits reducing the spacing between memory cells and thereby the density of the memory cells. In one embodiment, this invention incorporates shorter vertical diodes described in previously listed U.S. patent application Ser. No. 11/015,824. However, in this previous structure, an unintended programming problem may occur. As shown in FIG. 4 for the memory cell with a 350 nanometer diode, an unprogrammed memory cell exhibits a current versus voltage curve indicated by short dashed lines and labeled "Unprogrammed." For the reverse biased direction shown at the left side of the figure, current remains small until voltage in the reverse direction exceeds about 10 volts. Thus, unprogrammed memory cells will not carry large current when a reverse bias is applied at voltages below about 10 volts. This is important when programming voltages indicated by FIG. 1 are applied, since the large number of unselected cells all experience a relatively large reverse bias of about 8 volts. Returning to FIG. 4, when some of the memory cells have been programmed (their antifuses have been shorted), their voltage versus current curves are indicated by long dashed lines labeled "Programmed." The reverse bias current rises sharply at about 10 volts but may still be acceptable at a reverse bias of 8 volts. However, the curves of FIG. 5 for memory cells with a 250 nanometer thick diode show a less favorable picture. Reverse bias current is high but possibly acceptable for unprogrammed cells, but for programmed cells, indicated by the long dashed lines labeled "Programmed," current rises sharply at a reverse bias of about 8 volts, and a large number of previously programmed cells will cause the memory array to experience an unacceptable current during attempts to program other cells. Because of this, it is unacceptable to provide and program memory cells having short silicon diodes and silicon dioxide antifuses that must receive the programming voltages indicated in FIG. 1.

One solution to this problem has been discussed in U.S. patent application Ser. No. 11/174,234 of N. Johan Knall, titled "REVERSE-BIAS METHOD FOR WRITING MEMORY CELLS IN A MEMORY ARRAY." That patent application previously has been incorporated herein by reference. Another solution to the problem is to replace the silicon and silicon dioxide materials used in the antifuses and diodes with different materials having different breakdown strengths, different thicknesses, different dielectric constants, different acceleration factors (see below) and different band gaps.

Breakdown Strength

In order to program at lower voltage without making the antifuse too thin, the antifuse material must have a lower breakdown strength at an adequate thickness. Recent measurements of breakdown strength (the electric field strength at which the dielectric develops a sudden and sustained rise in leakage current) as a function of dielectric constants of materials have shown that there is a negative correlation between breakdown strength $E_{bd}$ and dielectric constant K. Silicon dioxide ($SiO_2$) has a dielectric constant of 3.9 and a breakdown strength of about 13 MV/cm (megavolts per centimeter). Higher-K dielectrics break down at lower field strengths, and therefore lower voltages for the same thickness. For optimum benefit, some embodiments incorporate a combination of changes. For antifuses, a material with a higher dielectric constant than silicon dioxide is used at a greater thickness than commonly used for silicon dioxide antifuses such that the change in dielectric constant is greater than the change in thickness. Hence a lower breakdown voltage is achieved along with greater manufacturing ability for the antifuse.

Antifuse Thickness

It is desirable to make antifuses with a thickness greater than 20 angstroms. If antifuse thickness becomes less than 20 angstroms (only a few atoms thick), rather than simply breaking down at a correspondingly lower voltage, another phenomenon occurs. Below about 20 angstroms, upon application of a voltage, the dielectric exhibits high tunneling current without breaking down, such that it is difficult to form a permanent conductive path. An antifuse should behave as an insulator until a breakdown voltage is reached, then develop a permanent conductive path due to melting in the presence of high current that occurs upon breakdown. Therefore it is desirable to use antifuse materials that have sufficiently high dielectric constants that they can be made thicker than 20 angstroms and still break down cleanly at a fairly low voltage.

Making the antifuse too thick also has problems. Increased thickness increases resistance (reduces leakage) through the antifuse to the point that voltage drop across the memory cell (antifuse plus diode) is almost entirely across the antifuse, and the diode no longer protects the antifuse sufficiently from being shorted when a reverse bias is applied to the memory cell. Therefore, it is undesirable to use antifuse materials that have such a high dielectric constant that they must be made thicker than about 65 angstroms. We have found that a thickness range of 20 to 65 angstroms avoids both these problems.

Antifuse Materials

Figure 2A:
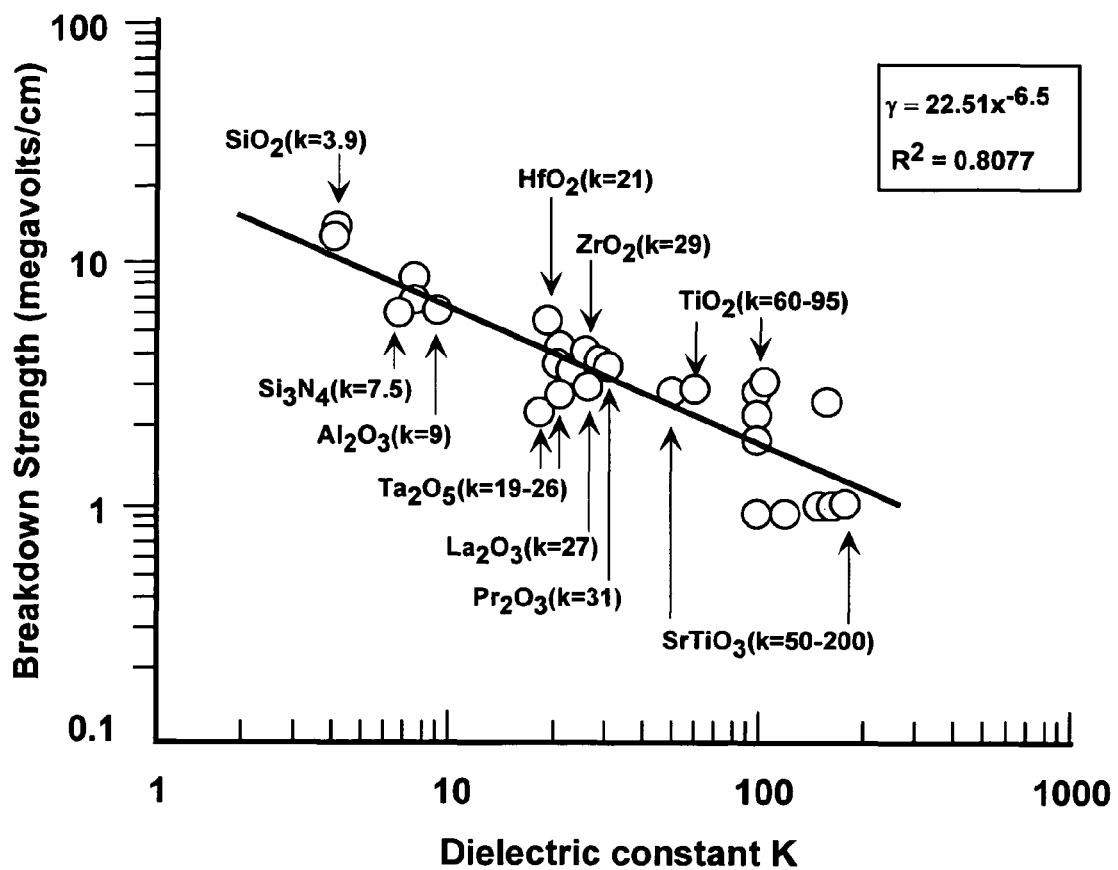
FIG. 2a shows breakdown strength as a function of dielectric constant for a range of materials usable in semiconductor devices.
Figure 2B:
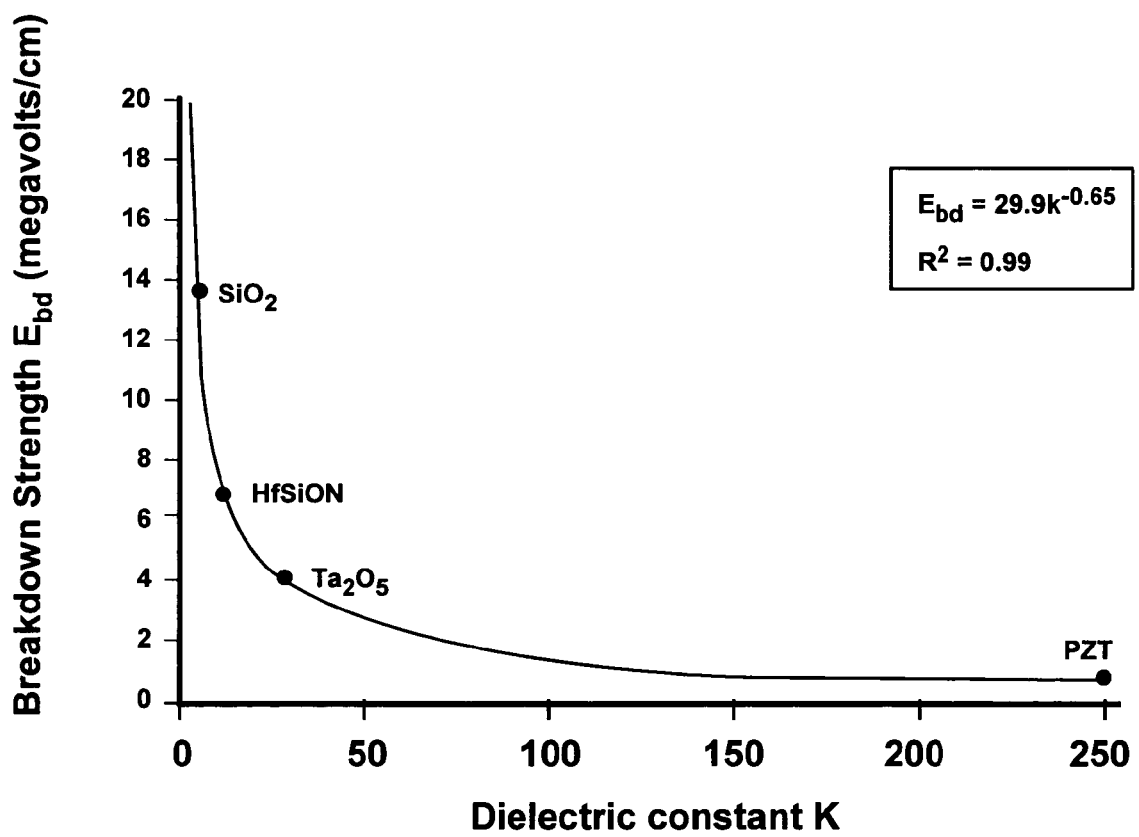
FIG. 2b shows another curve of breakdown strength as a function of dielectric constant.

Some of the materials indicated in FIG. 2a have dielectric constants appropriate for antifuse manufacture. It is desirable to use a material with dielectric constant more than about 5 and less than about 27. If the dielectric constant is much lower than 5 (as with silicon dioxide), the voltage needed to break down the thinnest practical antifuse will be too high to allow the low voltage operation that accompanies further shrinkage-of the memory array. If the dielectric constant is much higher than 27, the leakage is too large to maintain a long read lifetime, or the material must be too thick to break and form a low resistance path through the memory cell. Also, a thickness greater than about 65 angstroms interferes with a good aspect ratio for maintaining good step coverage during manufacturing. Thus materials used in the invention have a dielectric constant between about 5 and about 27. Materials used in the invention are manufactured to have a thickness of 20 to 65 angstroms.

Materials that appear satisfactory for making antifuses programmable at lower voltages can be described with the general formulas $X_vSi_wO_x$, $X_vO_w$ and $X_vSi_wO_xN_y$, where X represents an element from the family consisting of lanthanum (La), hafnium (Hf), tantalum (Ta), yttrium (Y), zirconium (Zr), and niobium (Nb) and the subscripts v, w, x, and y can have any value that forms a stable compound. Thus, some acceptable materials include $HfO_2$, $La_2O_3$, LaSiON, $Hf_2SiO$, HfSiON, $Ta_2O_5$, $Ta_2O_3N$ to name a few.

Acceleration Factor

For both easy writing and undisturbed reading, it is desirable to have a material that sharply changes its behavior in response to changing the applied voltage. That is, when being written at a WRITE voltage, the material should break down and change states quickly, for example over a period of microseconds or less in order for the memory cell to be written. However, when being read at a somewhat lower READ voltage, the material should reliably not break down even over an extended lifetime on the order of 10 years. Thus, for a desirable material, a curve that relates time to breakdown to voltage should have a steep slope. This slope is called acceleration factor. We have recognized that a high acceleration factor is beneficial in the manufacture and operation of integrated circuit memory cells that use antifuses. Thus we have examined materials looking for high acceleration factors, thinking such materials could be used to make antifuses and diodes in memory cells. As presented in the above McPherson et al. paper, the characteristic breakdown strengths $E_{bd}$ of $SiO_2$, HfSiON, $Ta_2O_5$, and PZT are 13.6, 7, 4, and 0.8 MV/cm, respectively. However, even though the breakdown strength $E_{bd}$ is observed to decrease with dielectric constant K, the field acceleration factor γ is observed to increase with K. We see that $E_{bd}$ decreases as approximately $K^{-0.65}$, while γ increases as $K^{0.66}$. For high-K materials, the field acceleration factory γ is significantly greater than that for $SiO_2$.

Desirable Antifuse Characteristics

Figure 6:
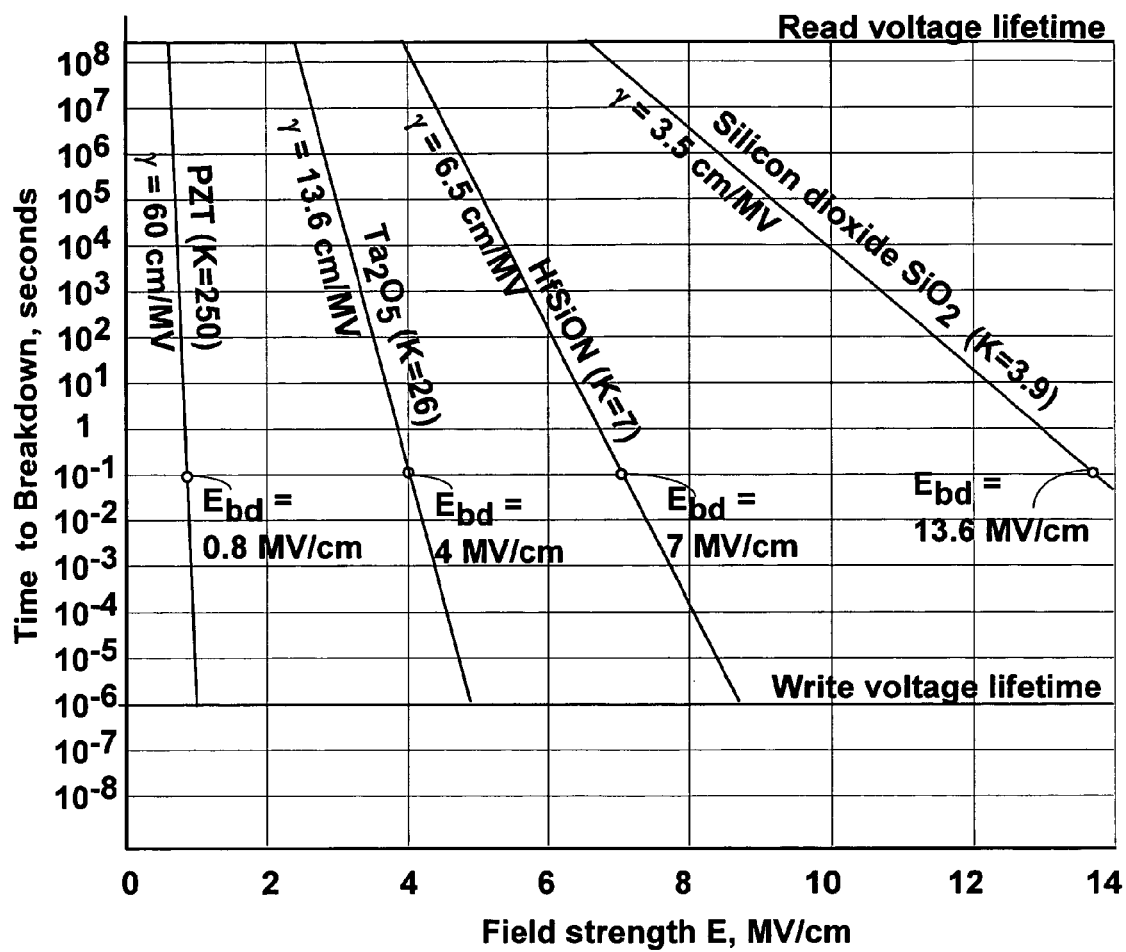
FIG. 6 shows four curves of acceleration factor, which is time-to-breakdown as a function of electric field strength.

FIG. 6 shows empirical results for four materials described in the McPherson et al. paper, including silicon dioxide for comparison. Silicon dioxide has an acceleration factor γ of 3.5 cm/MV. This means that time to breakdown decreases moderately as voltage is increased. But in order to achieve a sufficiently short write delay, a very high write field strength (off the scale of FIG. 6) must be applied. To achieve this high field strength, the programming voltage must be very large, even when the silicon dioxide antifuse is made as thin as feasible in manufacturing. For the thinnest feasible silicon dioxide thickness, the minimum write voltage for reasonable write performance is about 7 volts, which is higher than desired for scaling the memory array support circuits below a 300 nanometer gate length. Other materials give improved results. Other materials have a higher dependence on voltage, as indicated by the steeper curves. The next curve in FIG. 6 is for hafnium silicon oxynitride, HfSiON. This material has a steeper acceleration factor γ of 6.5 cm/MV and a breakdown field strength $E_{bd}$ of 7 MV/cm. The steepness of the HfSiON curve means that writing can be done quickly at a 38 angstrom thickness, and reading may be done at 1.5 volts, which leaves a lifetime of the memory cells in the acceptable 10-year range.

The acceleration factor curves of FIG. 6 suggest a method that can be used to select materials with optimum antifuse characteristics regarding thickness and dielectric constant that satisfy requirements for lifetime and operating voltage in an antifuse memory array. Because of the straight line shape of the acceleration factor curves and the inverse exponential relationship between $E_{bd}$ and $\gamma$, as described above, all the lines in FIG. 6 will converge at a point far above the data range shown. The line equations all have the form "y=mx+b", where the slope "m" depends on K but not thickness, and the intercepts "b" are all the same. The desired read lifetime and write lifetime are labeled on horizontal lines in FIG. 6. There are similar lines for other materials that extend from the intercept b through the read lifetime to the write lifetime. For each of these materials, the ratio of field strength E at the read lifetime to field strength E at the write lifetime is about 46%. One aspect of the present invention is to use a read voltage that is less than about 46% of the write voltage. In one embodiment, the read voltage is between 0.8 volts and 1.5 volts. A material is chosen that has a dielectric constant in the range of 5 to 27. Setting the read field strength to be 46% of the write field strength determines an optimum thickness. For the material HfSiON, for example, the read field strength can be seen to be 4 MV/cm, which establishes an antifuse thickness of 38 angstroms for a read voltage of 1.5 volts.

Similarly, if tantalum oxide $Ta_2O_5$ at the high end of the desired K range, is selected, the desired read field strength is 2.4 MV/cm, and a thickness of 63 angstroms, at the top end of the desired thickness range is needed in order to assure the 10-year lifetime during reading. But another material, PZT, has such a steep acceleration curve and breaks down at such low field strength that this material would have to be 400 angstroms thick to be read at 1.5 volts over a long lifetime, so PZT is not practical for antifuses in memory cells that will be read at 1.5 volts. Of course, the same methodology can be used to choose a material and an optimum thickness and dielectric constant if a higher or lower read voltage is desired. For a higher or lower read voltage, the optimum material would have a correspondingly lower or higher dielectric constant.

Additional materials are practical for antifuse use. FIG. 7 shows a table of characteristics of some materials being considered for use in memories. In particular, the elements lanthanum (La), hafnium (Hf), tantalum (Ta), yttrium (Y), zirconium (Zr), praseodymium (Pr), titanium (Ti), and niobium (Nb) can all form oxides ($La_2O_3$, $HfO_2$, $Ta_2O_5$, $Y_2O_3$, $ZrO_2$, $Pr_2O_3$, $TiO_2$, $Nb_2O_5$) having higher dielectric constants and lower breaking strength than silicon dioxide ($SiO_2$). Other compounds and alloys, in particular, HfON, are also beneficial. Silicon has been found to improve temperature stability on transition metal oxides, and can be partially substituted for the transition metals. In this case, the ratio of the metal to silicon can be varied over a wide range.

Lower Band Gap Materials for Diodes

When considering materials for the diode of the memory cell, the band gap of the diode material must be considered. It is a further aspect of the invention that the read voltage is reduced by using a low bandgap semiconductor material to form the diode. Band gap is an intrinsic property of a material, and determines the threshold voltage of the diode and to some extent the conductivity through the diode. The band gap of silicon is about 1.12 electron volts at 300 degrees Kelvin. The read voltage using re-crystallized silicon diodes has been about 2 volts. At lower sensing currents, the read voltage for a silicon diode could drop a few hundred millivolts, but it is difficult to form a silicon diode that can be read reliably at 1.5 volts. It is desirable to form the diodes from a material with a lower band gap than that of silicon so that programming of antifuses in series with the diodes may be done more quickly and at lower programming voltages. Lifetime of the antifuses in the array is especially improved by using a lower read voltage because for the one-time-programmable memory cells of this invention, far more of the lifetime is spent in read operations. One group of materials that works well for diodes is the group consisting of germanium and the silicon germanium alloys. The diodes may be formed either by re-crystallizing or by depositing the selected diode material. The general formula $Si_xGe_{1-x}$ encompasses this family of materials (though elemental silicon is not included). As germanium content increases, the band gap decreases proportionally to 0.66 electron volts for pure germanium. So pure germanium has about half the diode threshold voltage of pure silicon. This $Si_xGe_{1-x}$ family is useful for reducing the required read voltage while retaining adequate current, and allows read voltage to be reduced by half a volt or more. Gallium antimony has a band gap of 0.72 electron volts and is also suitable for diodes. Indium arsenic at 0.36 electron volts and lead sulfide at 0.41 electron volts can provide even lower acceptable read voltages.

Programming and Reading

With the new materials discussed above, it is possible to quickly program (write) memory cells using forward diode bias voltages to the memory cells that are lower than used in the prior art. It is also possible to read the memory cells without disturbing their values over a long lifetime, expected to be on the order of 10 years.

Figure 8:
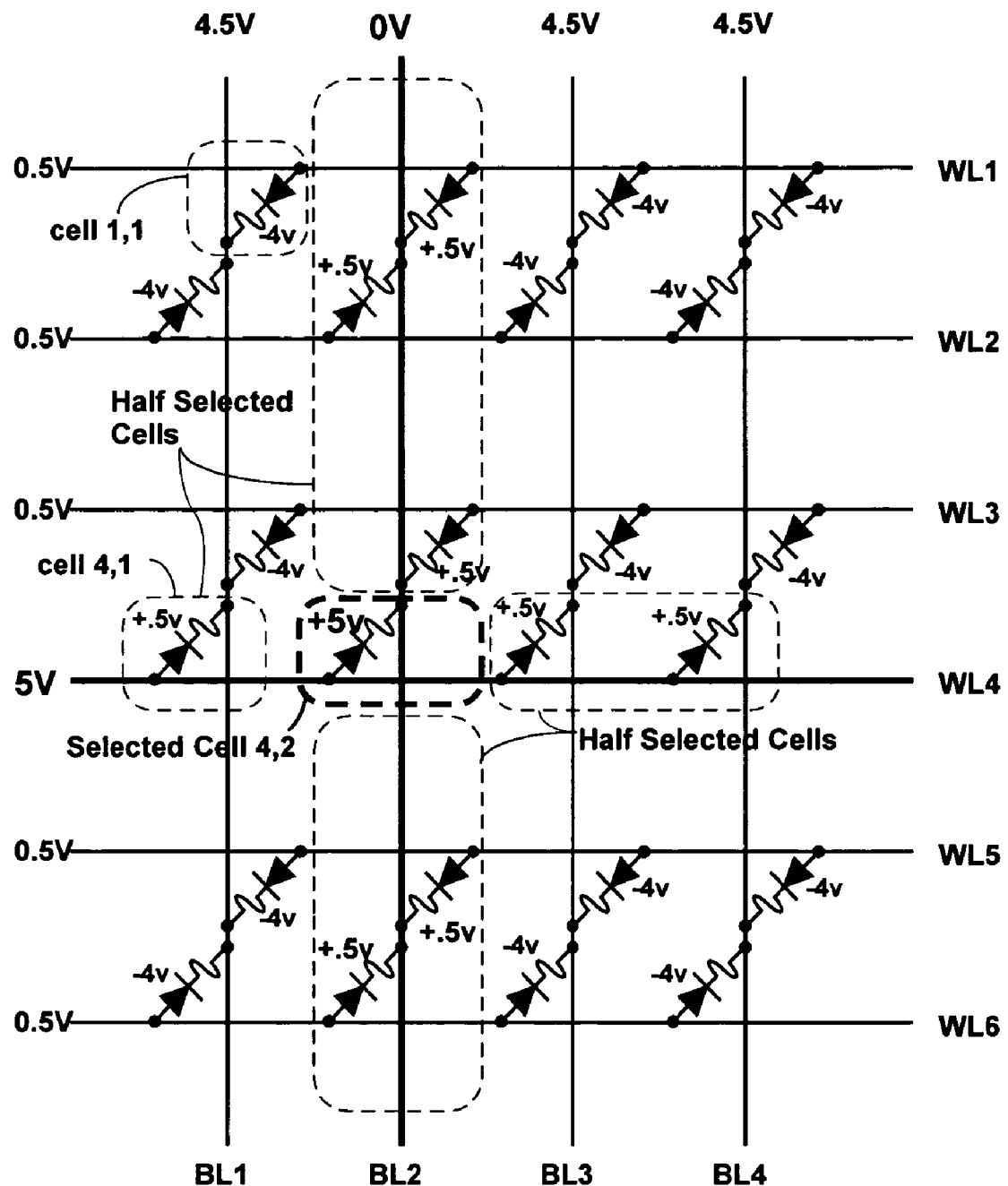
FIG. 8 shows voltages that can be used for programming memory cells according to the invention.

FIG. 8 shows application of voltages for writing a selected memory cell. It is easy to see by comparing FIG. 8 to FIG. 1 that all voltage levels are lower. By selecting thickness and dielectric constant of the diodes and antifuses, the back bias voltages across the memory cells (in FIG. 8, –4 volts) can be predominantly across the diode of the memory cell, especially if the antifuse has been previously programmed, so that no unintended programming occurs. In one embodiment, two successive programming voltages are applied. The first voltage shorts the antifuse to form a conductive path and the second voltage causes current to pass through the shorted antifuse and further reduces resistance of the shorted antifuse. In one embodiment, the first voltage is chosen to provide the desired write field and the subsequent current through the antifuse is not well controlled due to the very sudden pop event. The second voltage is about two volts higher at the array line driver, and is provided through a current limiting circuit such as any well know current mirror circuit. The current limit is adjusted to give a useful range of programmed cell resistance values, but the voltage at each memory cell is less well controlled due to variation in location along the array lines, which have inherent resistance drops.

Figure 9:
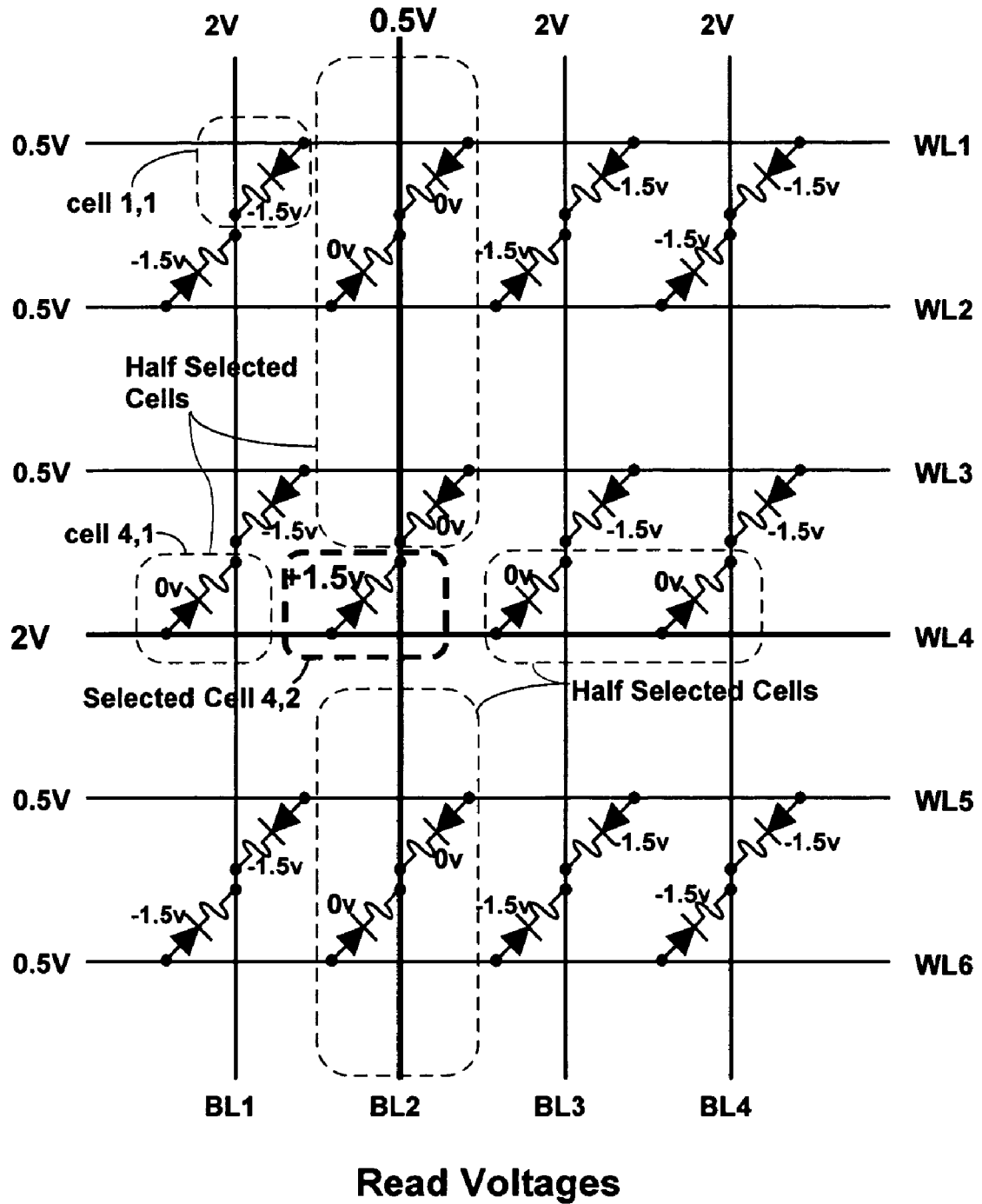
FIG. 9 shows voltages that can be used for reading memory cells according to the invention.

FIG. 9 shows application of voltages for reading a selected memory cell. As can be seen in FIG. 9, the selected cell receives a forward read voltage of 1.5 volts, the half-selected cells receive zero volts, and the unselected cells receive a reverse bias of –1.5 volts. These voltages are low enough that no programming of unselected or half-selected cells occurs, and yet voltage to the selected cell (which may be a row or multi-layer stack of selected cells) is sufficient to determine the state of the antifuse in the selected cell. In one embodiment using an antifuse material of hafnium silicon oxynitride in a layer 38 angstroms thick, the READ voltage applied to the selected cell is 1.5 volts. If the cell has been programmed, current flowing from the word line WL4 to bit line BL2 is about 1 microamp, while if the cell has not been programmed, the current is about 1 nanoamp. Thus the state of this memory cell can be observed. Reverse bias voltage applied to unselected cells is −1.5 volts, which is low enough to produce negligible leakage current. Bias to half-selected cells is 0 volts, which produces no current. In another embodiment not shown, the diodes are reversed to connect the anodes to the bit lines. During reading, the selected word line is at ground voltage, the selected bit line is current-sensed and clamped at a voltage of 1.5 volts. The unselected word lines are at 1.5 volts, and the unselected bit lines are at ground voltage. Thus all cells experience the same voltage drop as those shown in FIG. 9.

Figure 10:
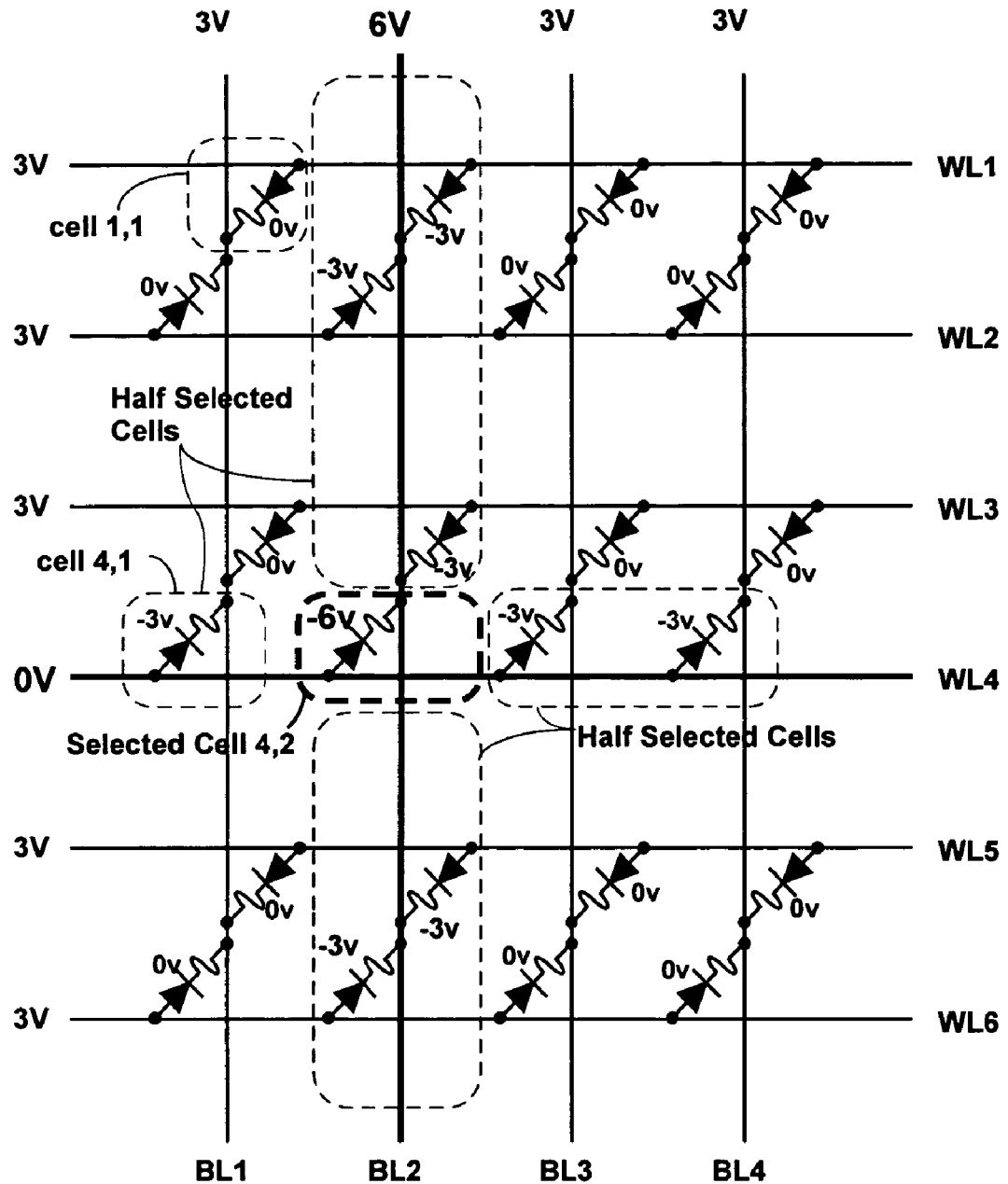
FIG. 10 shows voltages that can be used for writing memory cells with reverse bias, according to another embodiment of the invention.

FIG. 10 shows another application of voltages for writing a selected memory cell. In FIG. 10, voltages are applied to reverse bias the selected cell. The biasing arrangement of FIG. 10 experiences very low leakage because all unselected cells receive zero bias. The benefits of reverse biasing are further described in Knall, U.S. patent application Ser. No. 11/174,234. The smaller voltage values of FIG. 10, however, are achieved by using the materials discussed above.

Thus the selection of new materials discussed above allows programming and reading at lower voltages than the prior art. Because the devices can be scaled to smaller dimensions, both power and cost of manufacturing are reduced.

A word line arrangement having multiple layers of word line segments for three-dimensional memory arrays may be used with memory cells of the present invention. Such a word line arrangement is described by Roy E. Scheuerlein in detail in U.S. patent application Ser. No. 10/403,844, which is incorporated herein by reference in its entirety. A method for sensing while programming a non-volatile memory cell described by Kleveland, et al., in U.S. Pat. No. 6,574,145, may be used with the present invention for sensing memory cell values, and is incorporated herein by reference in its entirety.

The foregoing detail has described only a few of the many possible implementations of the present invention. For this reason, this detailed description is intended to illustrate, not to limit. Variations and modifications of the embodiments disclosed herein may be made based on the description set forth herein, without departing from the scope and spirit of the invention. It is only the following claims, including all equivalents, that are intended to define the scope of this invention. Although certain embodiments have been described in the context of a three-dimensional, field-programmable, memory array, it should be appreciated that such an array is not necessarily required. Moreover, the embodiments described above are specifically contemplated to be used alone as well as in various combinations. Accordingly, other embodiments, variations, and improvements not described herein are not necessarily excluded from the scope of the invention.

The invention claimed is:

1. A memory cell for reliable low voltage reading and writing comprising:
 a diode in series with an antifuse, the antifuse being made of one of $X_vSi_wO_x$ and $X_vSi_wO_xN_y$, wherein X represents an element from the family consisting of Pr, Ti, La, Hf, Ta, Y, Zr, and Nb, and the subscripts v, w, x, and y have positive non-zero values that form a stable compound, and wherein the antifuse has a dielectric constant between 5 and 27, and further wherein the antifuse has a thickness between 20 and 65 angstroms.

2. A memory cell for reliable low voltage reading and writing as in claim 1, wherein the antifuse has a dielectric constant between 5 and 27.

3. A memory cell for reliable low voltage reading and writing as in claim 1, wherein the diode comprises a material having a band gap lower than that of silicon.

4. A memory cell for reliable low voltage reading and writing as in claim 3, wherein the band gap is lower than 1.1 electron volts.

5. A memory cell for reliable low voltage reading and writing as in claim 3, wherein the diode comprises a material from the group consisting of germanium (Ge) and any silicon-germanium alloy ($Si_xGe_{1-x}$).

6. A memory cell for reliable low voltage reading and writing as in claim 1, wherein the memory cell is in an array of such memory cells.

7. A memory cell for reliable low voltage reading and writing as in claim 6, wherein the array of such memory cells is a monolithic 3-dimensional array in which the memory cells are formed in a plurality of memory cell levels in an integrated circuit device.

8. A memory cell for reliable low voltage reading and writing as in claim 1, wherein the antifuse comprises LaSiON, $Hf_2SiO$, HfSiON, $HfSiO_4$, $Y_2SiO_5$, or $ZrSiO_4$.

9. A memory cell for reliable low voltage reading and writing comprising:
 a diode in series with an antifuse, the antifuse being formed from a layer made of an insulating material having a dielectric constant in the range of 6 to 27;
 wherein the antifuse comprises a material taken from the family consisting of $X_vO_w$, $X_vO_wN_x$ and $X_vN_w$; wherein X represents an element from the family consisting of Hf, Pr, La, Y, and Nb; and wherein the subscripts v, w, and x have non-zero values that form a stable compound and further wherein the antifuse has a thickness between 20 and 65 angstroms; and
 wherein the diode is formed from a semiconductor material with a band gap smaller than that of silicon.

10. A memory cell for reliable low voltage reading and writing as in claim 9, wherein the band gap is smaller than 1.12 electron volts.

11. A memory cell for reliable low voltage reading and writing as in claim 9, wherein the diode comprises a material from the group consisting of germanium (Ge) and a silicon germanium alloy ($Si_xGe_{1-x}$).

12. A memory cell for reliable low voltage reading and writing as in claim 9, wherein the antifuse comprises $HfO_2$, HfN, $PrO_2$, $Pr_2O_3$, PrN, $La_2O_3$, LaN, $Y_2O_3$, YN, NbO, $Nb_2O_5$, or NbN.

13. A memory cell for reliable low voltage reading and writing as in claim 9, wherein the memory cell is adapted to be programmed with a voltage less than 6 volts.

14. A memory cell for reliable low voltage reading and writing as in claim 9, wherein the diode comprises re-crystallized material.

15. A memory cell for reliable low voltage reading and writing as in claim 9, wherein the diode is formed from deposited material.

16. A memory cell for reliable low voltage reading and writing as in claim 9, wherein the diode is adapted to be read using a bias voltage less than 2 volts.

* * * * *